US008539300B2

(12) United States Patent
Otsuka

(10) Patent No.: US 8,539,300 B2
(45) Date of Patent: Sep. 17, 2013

(54) INFORMATION RECORDING AND REPRODUCING APPARATUS FOR WRITING USER DATA RECEIVED FROM AN EXTERNAL DEVICE TO A RECORDING MEDIUM USING GENERATED PARITY DATA CORRESPONDING TO THE USER DATA

(75) Inventor: Takeshi Otsuka, Hyogo (JP)

(73) Assignee: Panasonic Corporation, Osaka (JP)

( * ) Notice: Subject to any disclaimer, the term of this patent is extended or adjusted under 35 U.S.C. 154(b) by 309 days.

(21) Appl. No.: 12/960,851

(22) Filed: Dec. 6, 2010

(65) Prior Publication Data
US 2012/0017139 A1     Jan. 19, 2012

(30) Foreign Application Priority Data

Jul. 13, 2010  (JP) .................................. 2010-158395

(51) Int. Cl.
*G06F 11/00* (2006.01)
(52) U.S. Cl.
USPC ........................................... 714/752; 714/6.2
(58) Field of Classification Search
None
See application file for complete search history.

(56) References Cited

U.S. PATENT DOCUMENTS

| | | | |
|---|---|---|---|
| 2004/0168101 A1* | 8/2004 | Kubo ................................. | 714/6 |
| 2008/0168304 A1* | 7/2008 | Flynn et al. ....................... | 714/7 |
| 2009/0327802 A1* | 12/2009 | Fukutomi et al. ................. | 714/6 |

FOREIGN PATENT DOCUMENTS

JP     2006-18373     1/2006

* cited by examiner

*Primary Examiner* — Michael Maskulinski
(74) *Attorney, Agent, or Firm* — Wenderoth, Lind & Ponack, L.L.P.

(57) ABSTRACT

An information recording and reproducing apparatus writes user data received from an external device into a recording medium and reads the user data from the recording medium so as to transmit the user data to the external terminal. The information recording and reproducing apparatus includes an external interface unit operable to transmit and receive the user data to and from the external device, a first ECC generator operable to generate parity data corresponding to the user data, an access unit operable to control recording and reading of the user data or the parity data to and from the recording medium, a recording controller operable to record the user data and the first parity data to the recording medium via the access unit, an ECC correcting unit operable to correct an error of the user data read from the recording medium using the parity data read from a nonvolatile memory via the access unit, and a reproducing controller having a first reproducing mode for reading and reproducing the user data without reading the parity data from the recording medium at the time of reproducing data and a second reproducing mode for reading and reproducing at least the parity data from the recording medium, the reproducing controller operable to detect presence or non-presence of an error of the user data read from the recording medium during execution of the first reproducing mode and executing the second reproducing mode when the presence of an error is detected.

10 Claims, 10 Drawing Sheets

Fig.2

| PAGE 0 |
| --- |
| PAGE 1 |
| PAGE 2 |
| PAGE 3 |
| ⋮ |
| PAGE 126 |
| PAGE 127 |

INFORMATION RECORDING AND REPRODUCING APPARATUS FOR WRITING USER DATA RECEIVED FROM AN EXTERNAL DEVICE TO A RECORDING MEDIUM USING GENERATED PARITY DATA CORRESPONDING TO THE USER DATA

BACKGROUND

1. Technical Field

The technical field relates to an information recording and reproducing apparatus that reads and writes data from and to a recording medium such as a nonvolatile memory.

2. Related Art

Conventionally, information recording and reproducing apparatus such as SD (Secure Digital) card as card type recording media containing a flash memory is ultracompact and ultraslim. Due to its easy handling, it is widely used for recording data in an image in digital camera, mobile device or the like.

Flash memory included in the information recording and reproducing apparatus has a lot of physical blocks each of which has a constant size, and data can be erased on a physical block basis.

In these latter days, in order to cope with the demands for enlargement of recording capacity of a flash memory, a flash memory that can store data of 2 bits or more in one cell (hereinafter, "multi-valued flash memories") is commoditized.

FIG. 10 is a diagram illustrating one example of a relationship between the number of electrons accumulated in a floating gate of a quaternary flash memory capable of storing 2-bit (quaternary) data in one cell and a threshold voltage (Vth). As shown in FIG. 9, the quaternary flash memory manages four accumulation states of electrons by four states in the floating gate according to the threshold voltage (Vth). In a erase state of the flash memory, an electric potential is the lowest, and this state is represented by (1,1). The voltage threshold discretely rises as the electrons are further accumulated, and states of the rising steps are represented by (1,0), (0,0) and (0,1), respectively. In the quaternary flash memory, 2-bit data can be recorded in one memory cell by utilizing the rise of the electric potential in proportional to the number of accumulated electrons.

However, in the quaternary flash memory, since the four states are discriminated by an accumulation amount of the electrons, a difference in the threshold voltage among the states is smaller than that in a binary flash memory.

When rewriting of data to the flash memory is repeated, a gate oxide film is slightly deteriorated by injection drawing of the electrons to and from the floating gate. This deterioration is repeated, so that a lot of electron traps are formed and thus the actual number of electrons to be accumulated in the floating gate is decreased. Particularly when a semiconductor process is miniaturized, the number of the electrons to be accumulated in the floating gate decreases, and thus an influence of the electron traps becomes great.

A problem of the deterioration in data retaining characteristics in the flash memory becomes noticeable according to the multi-valued recording and the miniaturization of the semiconductor process that support the enlargement of the capacity of the flash memory.

A method for solving the above problem includes:
(1) restriction of the number of times of rewriting; and
(2) strengthening of error correction.

JP-A-2006-18373 discloses a flash memory that strengthens an error correcting ability and enables the restriction of the deterioration in the data retaining characteristics. In JP-A-2006-18373, in the flash memory including a plurality of chips, blocks in respective chips of the flash memory are related. The plurality of related blocks is treated as one group of the blocks, and one block in the group are allocated as a block where parity data related to user data written to another block in this group is recorded.

In the method described in JP-A-2006-18373, RAID 5 used in a hard disc drive (HDD) is applied to a flash memory. However, when this method is applied to a semiconductor memory such as a flash memory, redundancy is increased by parity data, thereby deteriorating a transmission performance of the data. Further, a power consumption is increased by a writing amount of the parity data. That is to say, the high-speed transmission and the lower power consumption cannot be fulfilled.

Particularly in applications for business purpose that record moving images in memory cards, the transmission performance may satisfy real-time recording at the time of writing, but a high-speed transmission performance so as to enable high-speed uploading of the recorded data to servers, for example, is required at the time of reading.

SUMMARY

From the viewpoint of the above problem, it is an object to provide an information recording and reproducing apparatus that improves error durability and simultaneously can satisfy both high-speed transmission and low power consumption at the time of reading.

In order to solve the problems, an information recording and reproducing apparatus for writing user data received from an external device to a recording medium, reading the user data from the recording medium and transmitting the user data to the external device is provided. The apparatus includes an external interface unit operable to transmit and receive the user data to and from the external device, a first ECC generator operable to generate parity data corresponding to the user data, an access unit operable to control recording and reading of the user data or the parity data to and from the recording medium, a recording controller operable to record the user data and the first parity data to the recording medium via the access unit, an ECC correcting unit operable to correct an error of the user data read from the recording medium using the parity data read from a nonvolatile memory via the access unit, and a reproducing controller having a first reproducing mode for reading and reproducing the user data without reading the parity data from the recording medium at the time of reproducing data and a second reproducing mode for reading and reproducing at least the parity data from the recording medium, the reproducing controller operable to detect presence or non-presence of an error of the user data read from the recording medium during execution of the first reproducing mode and executing the second reproducing mode when the presence of an error is detected.

In the information recording and reproducing apparatus according to the above aspect, the first reproducing mode for reading not parity data but user data to reproduce it is used, so that lowering of the transmission speed of the parity data and an increase in a current consumption can be prevented. Further, the second reproducing mode for reading and reproducing both parity data and user data is used so that an error is corrected and the error durability can be improved.

BRIEF DESCRIPTION OF DRAWINGS

FIG. 2 is a configurational diagram illustrating a erase block of a flash memory.

DETAILED DESCRIPTION OF PREFERRED EMBODIMENTS

First Embodiment

1. Configuration

Figure 1:
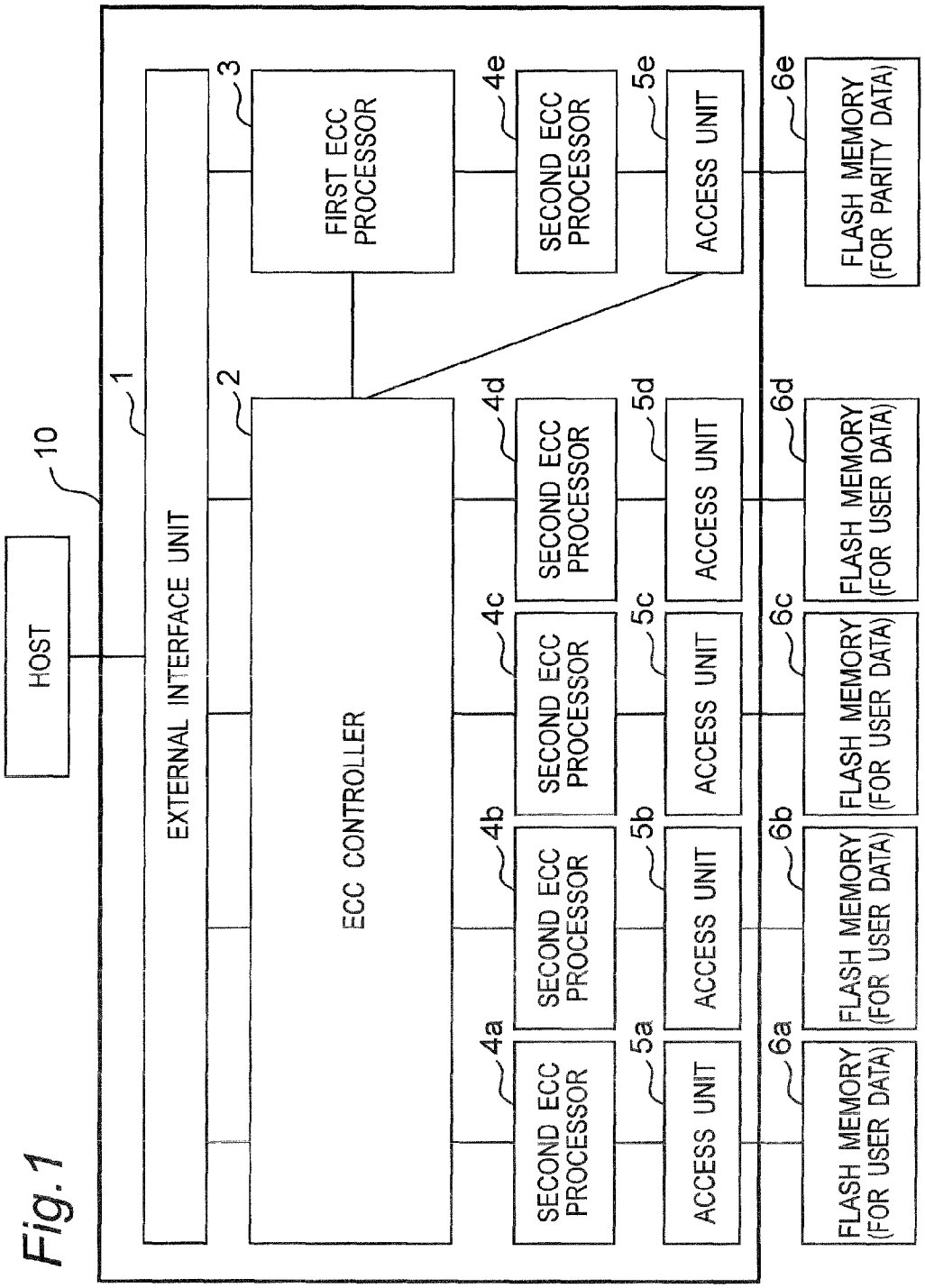
FIG. 1 is a configurational diagram illustrating an information recording and reproducing apparatus according to a first embodiment.

FIG. 1 is a configurational diagram illustrating an information recording and reproducing apparatus according to a first embodiment. The information recording and reproducing apparatus 10 according to the first embodiment includes an external interface unit 1, an ECC controller 2, a first ECC processor 3, second ECC processors 4a to 4e, and access units 5a to 5e. The information recording and reproducing apparatus 10 is connected to flash memories 6a to 6e via the access units 5a to 5e. User data are recorded in the flash memories 6a to 6d, and parity data generated for the user data are recorded in the flash memory 6e.

The external interface unit 1 is an interface that transmits and receives commands and user data to and from a host device. The access units 5a to 5e are connected to the flash memories 6a to 6e, and write and read data to and from the flash memories 6a to 6e.

The ECC controller 2, the first ECC processor 3 and the second ECC processors 4a to 4e respectively perform different operations at the time of writing and at the time of reading. For this reason, the operation at the time of writing is described first, and afterwards the operation at the time of reading is described.

2. Operation

2.1 Operation at the Time of Writing

The ECC controller 2 sorts user data input from a host device via the external interface unit 1 so as to transmit the user data to the first ECC processor 3, and divides the input user data to four user data so as to distribute the input user data and record the input user data to the four flash memories 6a to 6d. The first ECC processor 3 generates parity data in a first ECC code on a predetermined byte basis for the user data transmitted from the ECC controller 2. The second ECC processors 4a to 4d generate second ECC codes to which the parity data is added on a predetermined byte basis for the user data distributed by the ECC controller 2. Further, the second ECC processor 4e generates a second ECC code to which the parity data is added on a predetermined byte basis for the parity data about the first ECC code generated by the first ECC processor 3. The access units 5a to 5e write the data in the connected flash memories 6a to 6e.

Figure 2:
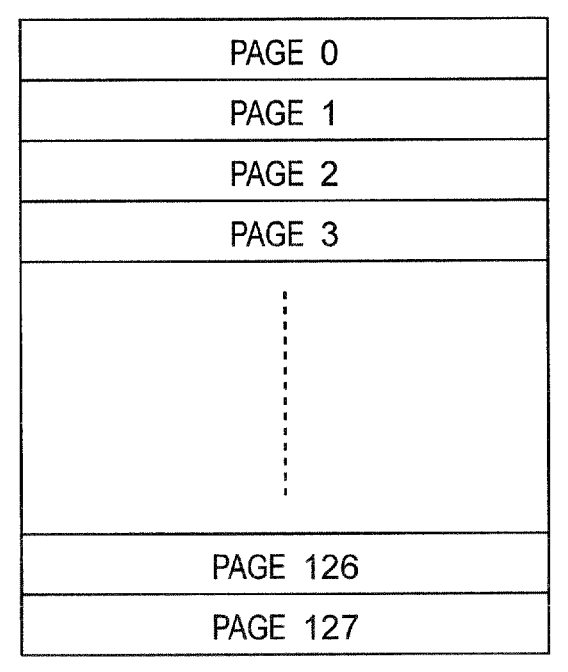

The flash memory has a plurality of erase blocks, and each erase block has a plurality of pages. FIG. 2 is a configurational diagram illustrating the erase blocks in the flash memory to be used in the first embodiment. As shown in FIG. 2, the erase block has 128 pages including pages 0 to 127, and the writing of data is performed on a page basis. In this flash memory, when a data capacity per page (page size) is 8 KB, a size of the erase block is 1 MB, and when the number of the erase blocks is 1 K, the capacity of the flash memory is 1 GB.

The first ECC processor 3 is described below. The first ECC processor 3 generates (5,4) ECC code. Concretely, the first ECC processor 3 performs an EXOR operation on continuous 4 bytes data to generate parity data of 1 byte. When error durability such as a defective semiconductor is taken into consideration, it is desirable that the data of 4 bytes of which first ECC code is generated is divided and the divided data is written to a flash memory of each of different chips. Therefore, user data to be input is allocated to the four flash memories (6a to 6d) on a page size basis of the flash memory (=8 KB). The first ECC processor 3 performs the EXOR operation on the data of total 4 bytes extracted in each one byte from data of 8 KB allocated to each flash memory, and generates parity data of 1 byte.

The above process is repeated, and generates parity data of 8 KB for user data of 32 KB input from the external interface unit 1.

Figure 3:
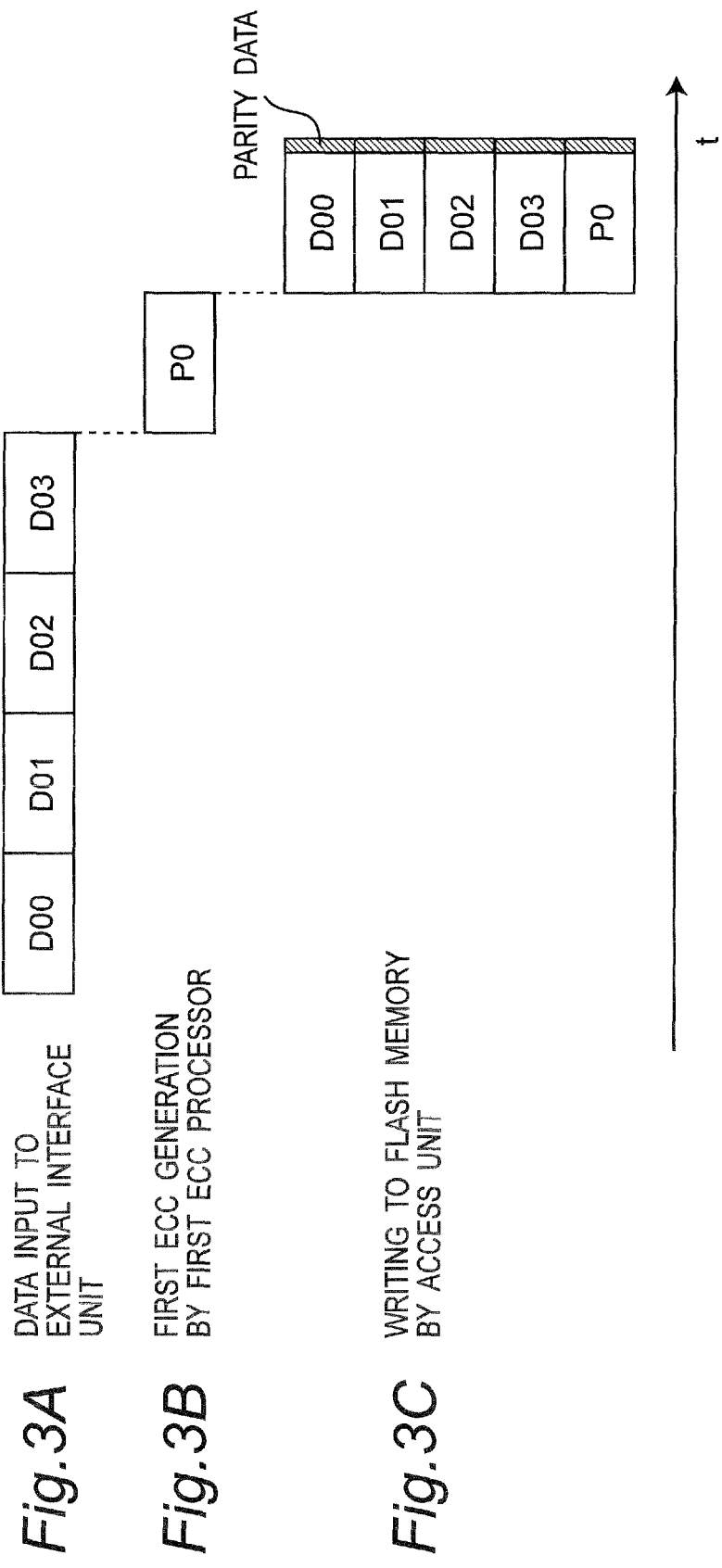
FIGS. 3A to 3C are timing charts of a main section at the time of writing according to the first embodiment.

FIGS. 3A to 3C are diagrams illustrating timings of the main section in the writing operation. FIG. 3A illustrates the input timing of data from the host device to the external interface unit 1. FIG. 3B illustrates the processing timing for generating the first ECC code in the first ECC processor 3. FIG. 3C illustrates the writing timing of data to the flash memories 6a to 6e by the access units 5a to 5e.

"D00", "D01", "D02" and "D03", respectively, in FIG. 3A show user data of 8 KB input to the external interface unit 1. "P0" in FIG. 3B shows parity data of 8 KB generated for the input user data of total 32 KB of data D00, D01, D02 and D03.

After the input of the user data D00, 001, D02 and D03 for four pages (=32 KB), the first ECC processor 3 starts the first ECC process on the user data of 32 KB as shown in FIG. 3B, and generates parity data of 8 KB (hereinafter, referred to as "first parity data").

After the first parity data P0 is generated, the second ECC processors 4a to 4e execute a second ECC process. The access units 5a to 5e write the data to the flash memories 6a to 6e, the data subject to the second ECC process by the second ECC processors 4a to 4e. The user data D00, D01, D02 and D03 are written to the flash memories 6a, 6b, 6c and 6d, and the parity data P0 is written to the flash memory 6e.

Concretely, each of the second ECC processors 4a to 4d adds second parity data to the user data of 8 KB on a predetermined byte basis. The second ECC processor 4e adds the second parity data to the first parity data generated by the first ECC processor 3 on a predetermined byte basis. Concretely, the second ECC processors 4a to 4d generate sixteen (520, 512) ECC codes to which the second parity data of 8 bytes is added on a 512-byte basis to the user data of 8 KB. In the first embodiment, a Reed-Solomon code is used as an error correcting code. However, a BCH code or the like can be used. Since these codes are publicly-known, detailed description thereof is omitted. The second ECC processor 4e generates the sixteen (520,512) ECC codes to which the second parity data of 8 bytes is added on a 512-byte basis to the first parity data of 8 KB. That is to say, the second ECC processor 4e generates the second ECC code in a manner that the second ECC code is orthogonal to the first ECC code. The second ECC codes generated in such a manner undertake a role for correcting errors of the target data of 512 bytes and a role for detecting an error and transmitting an error position in the first ECC code to the first ECC processor 3, when the error correction cannot be performed.

The above describes the operation at the time of writing in the information recording and reproducing apparatus 10 according to the first embodiment. The operation at the time of reading in the information recording and reproducing apparatus 10 according to the first embodiment is described below.

2.2 The Operation at the Time of Reading

The flash memories 6a to 6e include nonvolatile memories, and store user data and parity data written by the information recording and reproducing apparatus 10. The user data transmitted via the information recording and reproducing apparatus 10 is recorded to the flash memories 6a to 6d. The parity data generated by the first ECC processor 3 is recorded to the flash memory 6e.

The access units 5a to 5e read the data recorded in the flash memories 6a to 6e connected to the access units 5a to 5e, respectively. The reading access of the access unit 5e to the flash memory 6e that records the parity data generated by the first ECC processor 3 can be performed independently from reading access to the flash memories 6a to 6d that record the user data.

The second ECC processors 4a to 4e correct errors of the read data on a 512-byte basis. Since the second parity data of 8 bytes is added to the data of 512 bytes, the error correction of maximally 4 bytes can be performed in the Reed-Solomon code. When errors of 4 bytes or more occur, the second ECC processors 4a to 4e detect the read data as data of 512 bytes on which error correction cannot be performed, and transmit the data of 512 bytes as an error sector to the ECC controller 2.

The first ECC processor 3 performs the error correction on the error sectors on which error correction cannot be performed by the second ECC processors 4a to 4e using the first ECC code. Since the first ECC code is a (5,4) ECC code, the EXOR operation is performed on data of 4 bytes excluding the error sectors in data of 5 bytes configuring the ECC code. As a result, the data in which the error sector is detected can be corrected. The error sector is on a 512-byte basis, so that by performing the EXOR operation 512 times, a portion that becomes the error sector can be restored.

When the second ECC processors 4a to 4d perform the error correction, the ECC controller 2 outputs, via the external interface unit 1, the user data being read from the flash memories 6a to 6d and is subject to error correction by the second ECC processors 4a to 4d. When no error is present in the data read from the flash memories 6a to 6d, or when an error is present but the error correction can be performed by the second ECC processors 4a to 4d, a reproducing mode is defined as a "first reproducing mode".

Figure 5:
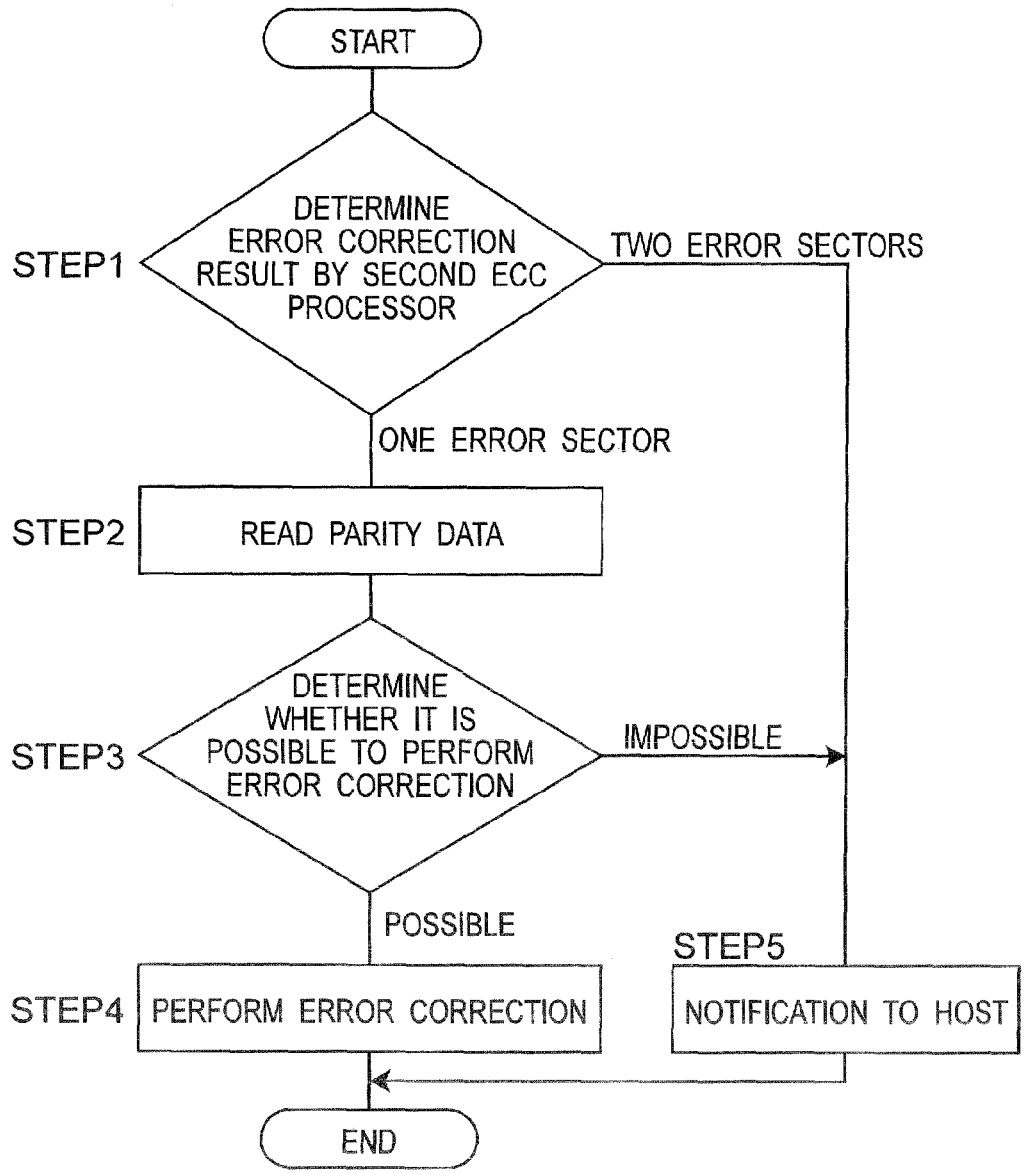
FIG. 5 is a flowchart illustrating control of an ECC controller according to the first embodiment.

On the other hand, when the error correction cannot be performed by the second ECC processors 4a to 4d, the ECC controller 2 executes as follows. The process of the ECC controller 2 is described with reference to a flowchart of FIG. 5.

(STEP 1) Determination of Error Corrected Result by the Second ECC Processors 4a to 4d In the error correcting process in the second ECC processors 4a to 4d, when one error sector is present, the ECC controller 2 goes to STEP 2. When two or more error sectors are present, the ECC controller 2 notifies a host of a reading error via the external interface unit 1 (STEP 5).

(STEP 2) Reading of Parity Data

The ECC controller 2 reads the parity data recorded in the flash memory 6e via the access unit 5e. The parity data to be read includes data that is related, by the first ECC code, to the data which is determined as the error sector in STEP 1.

(STEP 3) Determination Whether the Error Correction can be Made

The ECC controller 2 determines whether the error correction can be made on the parity data read in STEP 2. The determination whether the error correction can be made is made for the parity data that is related, by the first ECC code, to the user data determined as the error sector in STEP 1. When the error correction cannot be made, the ECC controller 2 notifies the host of occurrence of a reading error via the external interface unit 1 (STEP 5). When the error correction can be made, the sequence goes to STEP 4.

(STEP 4) Execution of Error Correction

The ECC controller 2 allows the first ECC processor 3 to make the ECC correction. A more concrete example is described with reference to FIG. 4A to 4E.

Figure 4:
FIGS. 4A to 4E are operation explanatory diagrams of a first ECC processor according to the first embodiment.

FIGS. 4A to 4E are operation explanatory diagrams of the first ECC processor 3. FIG. 4A illustrates the user data for one page (=8 KB) of the flash memory read from the flash memory 6a. The second ECC code uses the user data of 512 bytes as a component, and one page of the flash memory includes sixteen second ECC codes. The determination by the first ECC processor 3 whether the error correction can be made is performed on the sixteen second ECC codes on a 512-byte basis. In FIG. 4A, the second ECC codes are represented by SA0, SA1, . . . , SA15. Similarly, FIG. 4B illustrates the user data for one page (=8 KB) in the flash memory read from the flash memory 6b. The second ECC codes are represented by SB0, SB1, . . . , SB15. FIG. 4C illustrates the data for one page (=8 KB) in the flash memory read from the flash memory 6c. The second ECC codes are represented by SC0, SC1, . . . , SC15. FIG. 4D illustrates the data for one page (=8 KB) in the flash memory read from the flash memory 6d. The second ECC codes are represented by SD0, SD1, . . . , SD15. Further, FIG. 4E illustrates the parity data for one page (=8 KB) in the flash memory read from the flash memory 6e. The second ECC codes are represented by SP0, SP1, . . . , SP15. The hatched line portions in FIGS. 4A to 4E show the error sectors. In the drawings, SB1 and SC15 are the error sectors, they are targets for the error correction.

Since SB1 that is a target for the error correction is the ECC code related to SA1, SC1, SD1 and SP1, the EXOR operation is repeatedly performed on SA1, SC1, SD1 and SP1 at 512 times starting from a head byte, so that the error correction is made. Similarly, since SC15 that is a target for the error correction is an ECC code related to SA15, SB15, SD15 and SP15, the EXOR operation is repeatedly performed on SA15, SB15, SD15 and SP15 at 512 times starting from a head byte, so that the error correction is made STEP 1 to STEP 4 are sequentially executed so that the user data of which error correction cannot be made by the second ECC processors 4a to 4d can be restored, thereby improving the error durability.

When the error correction cannot be made by the second ECC processors 4a to 4d, the parity data recorded in the flash memory 6e is read and the user data is restored. This reproducing mode is defined as a "second reproducing mode".

The ECC controller 2 detects presence or non-presence of an error in the user data read from the flash memories 6a to 6d during the execution of the first reproducing mode. When the ECC controller 2 detects that an error is present, the second reproducing mode is executed. In other words, when the ECC controller 2 detects that an error is present, the reproducing mode is switched from the first reproducing mode to the second reproducing mode.

Figure 6:
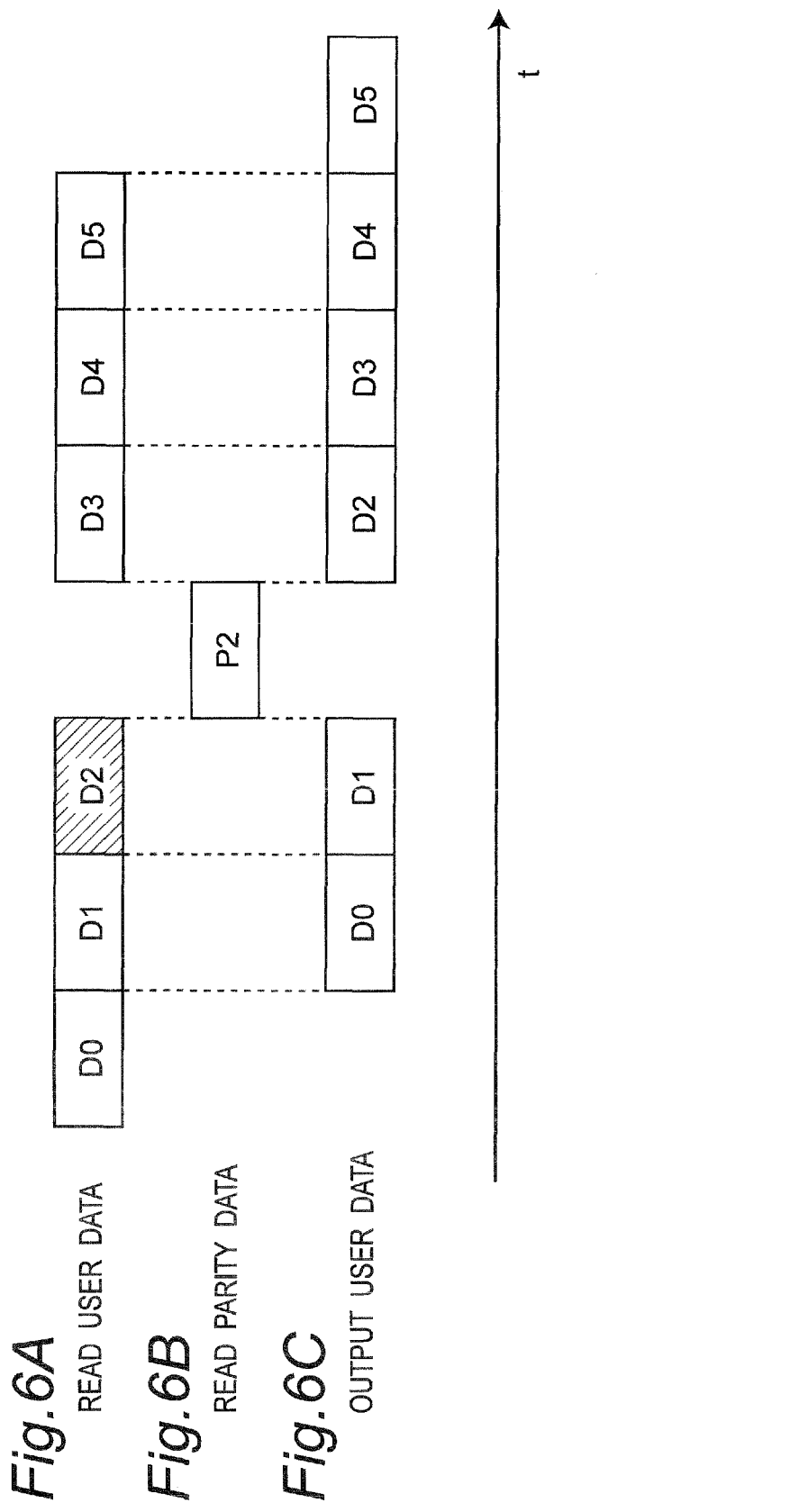
FIGS. 6A to 6C are timing charts of the main section at the time of reading according to the first embodiment.

FIGS. 6A to 6C illustrate operation timings of the information recording and reproducing apparatus 10 in the reading operation. FIG. 6A illustrates the timing at which the user data is read from the flash memories 6a to 6d. D0, D1, D2, . . . , D5 in FIG. 6A represent user data of 32 KB read from the four flash memories in parallel. D2 indicated by slated lines in FIG. 6A shows that an error sector is present. FIG. 6B illustrates the timing at which the parity data is read from the flash memory 6e. Data P2 is the parity data corresponding to the user data D2.

When an error sector is not present in the reading operation shown in FIG. 6A, the parity data does not have to be read from the flash memory 6e. Therefore, parity data other than the parity data P2 is not read. The ECC controller 2, therefore, controls the access unit 5e that controls the flash memory 6e in which the parity data is recorded so that a control signal such as a clock to the flash memory 6e becomes nonactive during the time of executing the first reproducing mode, concretely the time other than the time of reading the parity data P2. As a result, a power saving effect can be obtained.

FIG. 6C illustrates the output timing of the user data. As shown in FIG. 6C, the user data is read from the four flash memories 6a to 6d by 8-KB, and a check is made whether the generation of the error sector is present in each 8 KB of data. When an error sector is not present, read data is output. On the other hand, when an error sector is present, the parity data is read from the flash memory 6e, and the user data on which error correction is made by the first processor 3 is output.

3. Correspondence Relationship

The external interface unit 1 is one example of an external interface unit. The ECC controller 2 is one example of a recording controller and a reproducing controller. The first ECC processor 3 is one example of a first ECC generator and an ECC correcting unit. The second ECC processor 4e is one example of a second ECC correcting unit. The flash memories 6a to 6e are one example of recording media. The flash memories 6a to 6d are one example of recording media that record user data. The flash memory 6e is one example of a recording medium that records parity data.

4. Conclusion

The information recording and reproducing apparatus 10 according to the first embodiment has the first reproducing mode that does not read parity data of the first ECC code but reads user data to reproduce the user data, and the second reproducing mode that reads both the parity data of the first ECC code and the user data to reproduce them. When a reading error is not detected from the user data by the second ECC code, the first reproducing mode is used, and only when a reading error is detected by the second ECC code, the reproducing mode is switched to the second reproducing mode. As a result, the number of reading times of the parity data can be reduced as small as possible. Therefore, deterioration of a transmission speed and an increase in current consumption due to the parity data can be prevented. Actually, since it is assumed that a percentage at which the second reproducing mode is executed is 1% or less, it is possible to provide the information recording and reproducing apparatus 10 that can suppress a rise in the power consumption at the time of reading to 1% or less and improves error durability.

In the first embodiment, single correction is realized by using the (5,4) ECC code as the first ECC code, but the error correction may be reinforced by double correction using a (10,8) ECC code or the like.

In the above description, the number of the flash memories to be connected to the access units 5a to 5d, respectively, is one, but a plurality of flash memories may be connected to the access units 5a to 5d.

The parity data of the first ECC code is allocated to one flash memory (6e) but may be allocated to a plurality of flash memories. In this case, since a control cannot be made so that a clock of the flash memory recording the parity data is activated only when an error occurs, the power saving effect is reduced.

Second Embodiment

Figure 7:
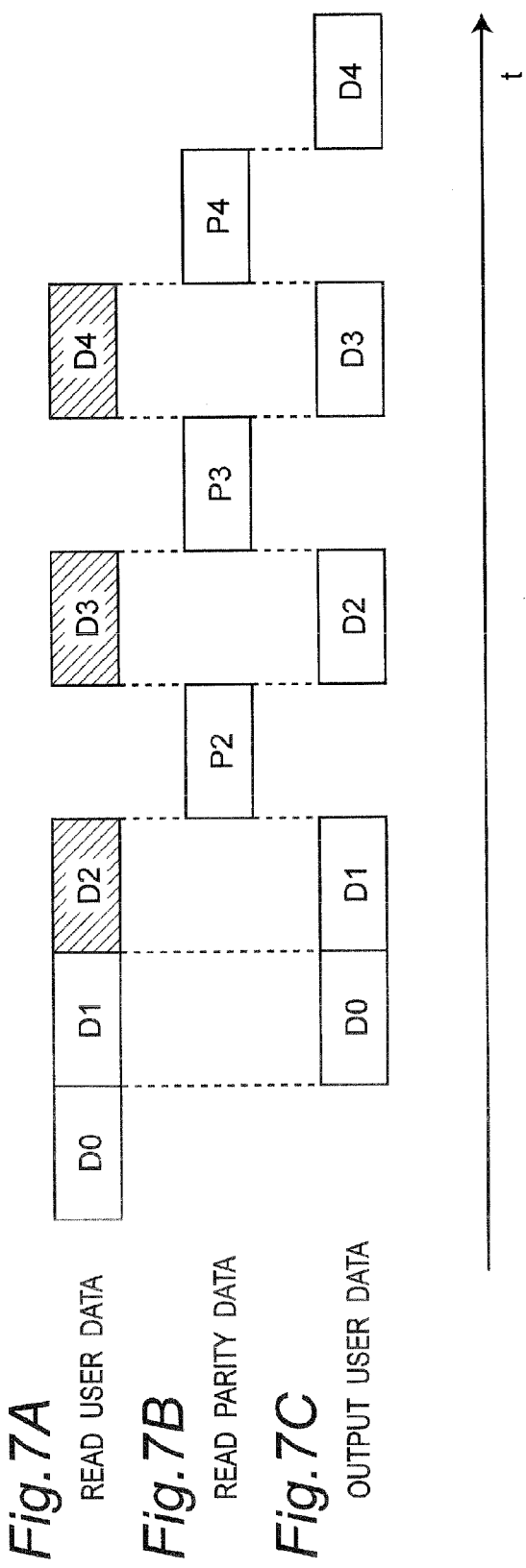
FIGS. 7A to 7C are timing charts of the main section at the time of generation of burst error according to the first embodiment.

In the first embodiment, only when the second ECC processors 4a to 4d cannot make the error correction, the parity data is read from the flash memory 6e, and the first ECC processor 3 make the error correction. In this case, however, when a burst error such that the first ECC processor 3 makes the error correction continuously occurs, a reading transmission rate is greatly deteriorated. FIGS. 7A to 7C illustrate operation timings of the information recording and reproducing apparatus 10 when a burst error occurs in the first embodiment.

FIG. 7A illustrating the timing at which the user data is read from the flash memories 6a to 6d. D0, D1, D2, . . . , D5 in FIG. 7A represent user data of 32 KB read from the four flash memories 6a to 6d. Error sectors where the second ECC processor cannot make the error correction are present in D2, D3 and D4 shown by hacthed lines in FIG. 7A. Further, the error sectors are continuous. FIG. 7B illustrates the timing at which the parity data is read from the flash memory 6e. P2, P3 and P4 represent parity data corresponding to the user data D2, D3 and D4.

FIG. 7C illustrates the output timing of the user data. The output timing of the user data is timing after the error correction is made by the first ECC processor 3. When the output of the user data of 32 KB is started, in parallel with this user data, next user data of 32 KB is read from the flash memories 6a to 6d as shown in FIG. 7A. For this reason, for the user data on which the error correction is performed by the first ECC processor 3, the time required for from reading the user data to outputting the user data becomes about twice as long as the case where the error correction is not performed by the first ECC processor 3. That is to say, the time required for reading the user data D2, D3 and D4 on which the first ECC processor 3 makes the error correction after a burst error occurs from the flash memories to output the user data from the flash memories becomes about twice as long as the time required for reading the user data D0 and D1 on which the first ECC processor 3 does not make the error correction to output the user data from the flash memories.

In order to solve this problem, for example, the user data D3 may be read in parallel with the reading of the parity data P2, but in the case of such a configuration, the user data D2 and D3 should be stored in the internal memory of the information recording and reproducing apparatus 10, and a circuit size increases. Therefore, the second embodiment provides the information recording and reproducing apparatus 10 that can suppress a deterioration of the reading transmission rate without increasing the internal memories even when a burst error occurs.

In order to realize this, in the second embodiment, when the second ECC processors 4a to 4d detect that the error correction cannot be made, the user data and the parity data are read from the four flash memories 6a to 6d that record the user data and the flash memory 6e that records the parity data in parallel only in a zone of a erase block where the user data on which error correction cannot be made is present. In other words, when the second ECC processors 4a to 4d detect that the error correction cannot be made and the reproducing mode is switched from the first reproducing mode to the second reproducing mode, the ECC controller 2 continuously executes the second reproducing mode on the erase block where the user data detected as having an error is present. That is to say, when the reproducing mode is switched from the first reproducing mode to the second reproducing mode, the ECC controller 2 continuously executes the second reproducing mode in a predetermined reading zone.

Figure 8:
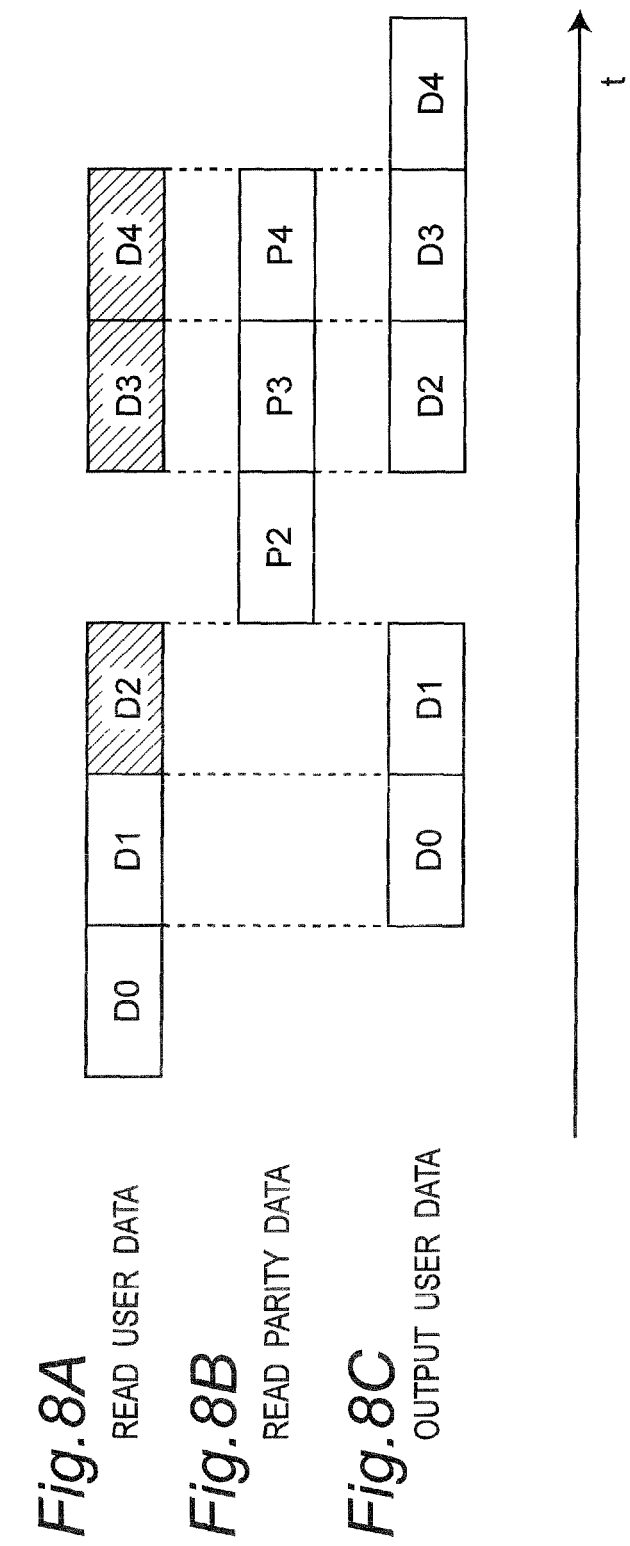
FIGS. 8A to 8C are timing charts of the main section at the time of burst error generation according to the modification of the first embodiment.

FIGS. 8A to 8C are timing charts in the second embodiment. FIG. 8A illustrates the timing at which the user data is read from the flash memories 6a to 6d. D0, D1, D2, ..., D4 in FIG. 8A represent user data of 32 KB read from the four flash memories 6a to 6d, and these user data D0, D1, D2, ..., D4 are recorded in the same erase block in each flash memory. FIG. 8A illustrates that an error sector is continuously present in the data D2, D3 and D4 indicated by hacthed lines.

FIG. 8B illustrates the timing at which the parity data is read from the flash memory 6e. Reference symbols P2, P3 and P4 represent parity data corresponding to the user data D2, D3 and D4. In FIG. 8B, since the presence of the error sector is detected by reading the user data D2, the parity data P2 of the user data D2 is read from the flash memory 6e. Since the next user data D3 and D4 are in the same erase block, the user data D3 and D4 and the corresponding parity data P3 and P4 are read from the flash memories 6a to 6e in fivefold parallel. Since the data D3 and D4 are read in parallel with their parity data P3 and P4, while the data D3 and D4 are being read, the error correction can be made. In comparison with the case of FIG. 7, time required up to the end of the error correction becomes about half.

FIG. 8C illustrate the output timing of the user data. When a burst error occurs, output of the user data on which error correction is firstly made by the first ECC processor 3 requires the equivalent time to that in the case of FIG. 7, but afterwards, the process can be completed for the equivalent time to that in the case where the error sector is not generated.

When the second ECC processors 4a to 4d detect the presence of the user data of which error correction cannot be made, the data are read from the four flash memories 6a to 6d that record the data and from the flash memory 6e that records the parity data in parallel only in a zone of the erase block where the user data on which error correction cannot be made is present. As a result, the information recording and reproducing apparatus 10 can be provided that suppresses a deterioration of the reading transmission rate without increasing the internal memories even when a burst error occurs.

Since the first ECC process is single correction, the time required for the error correction is ignored. However, when the number of error corrections increases, the time required for the error correction cannot be ignored. For this reason, the transmission speed is lowered by the time required for the error correction.

The data are read from the four flash memories that record the data and one flash memory that records the parity data in parallel only in the zone of the erase block detected that the user data on which error correction cannot be made is present. However, a burst error length may be switched according to an assumed error factor. However, data retaining characteristics of the flash memories are deteriorated according to an increase in the number of rewriting times, and the number of rewriting times may vary mostly on a erase block basis. For this reason, it goes without saying that the erase block is an important parameter.

Third Embodiment

In these days the external interface of the flash memories is varying into a high-speed interface using both edges of a clock. However, since the writing speed of the flash memories is not particularly heightened, as to a flash memory having a high-speed interface, it is highly possible that a plurality of the flash memories is connected to one memory bus.

The third embodiment provides the information recording and reproducing apparatus that can improve the error durability and suppress the current consumption at the time of the high-speed reading transmission using the flash memories having the high-speed interface.

Figure 9:
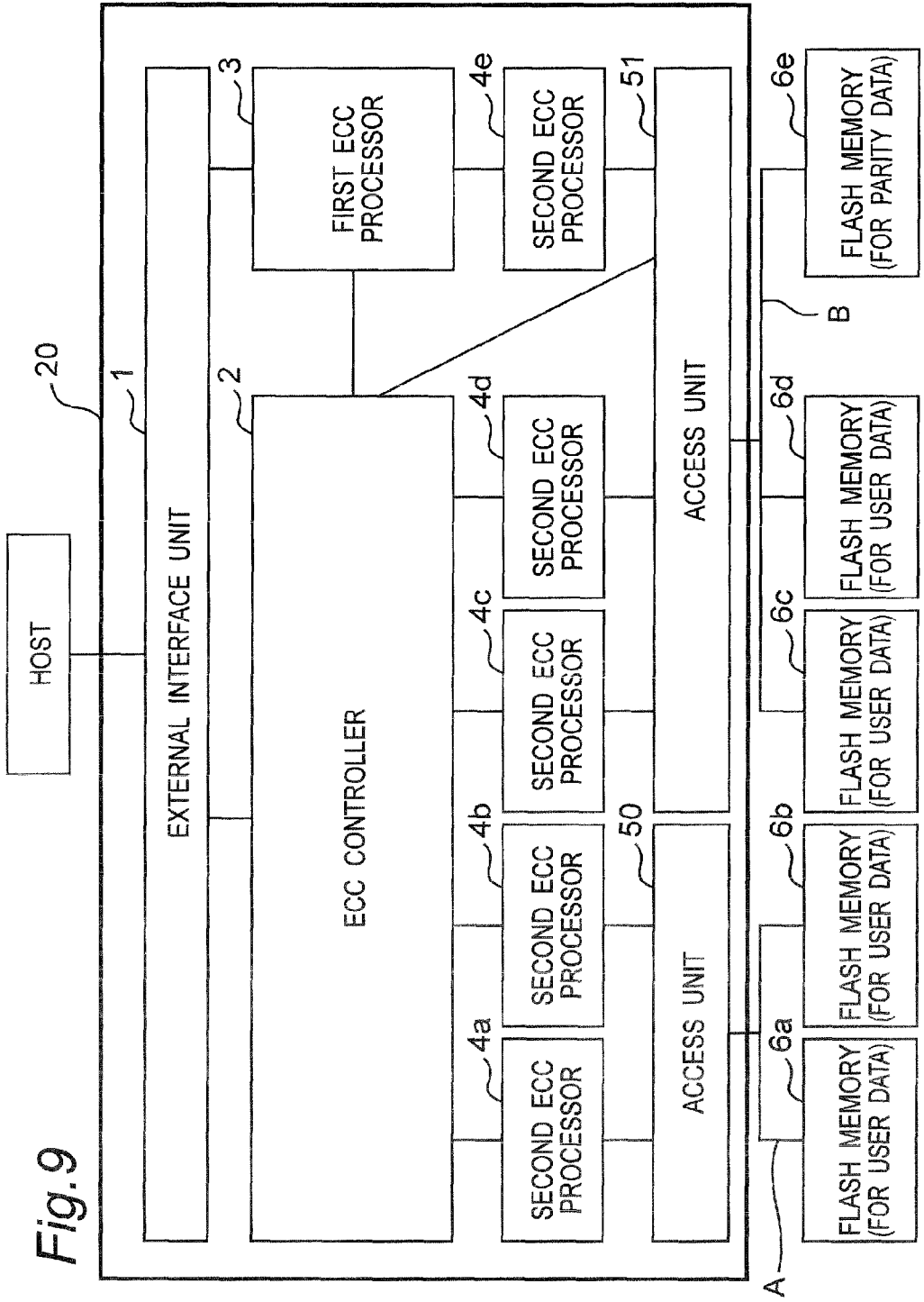
FIG. 9 is a configurational diagram illustrating the information recording and reproducing apparatus according to a second embodiment.
Figure 10:
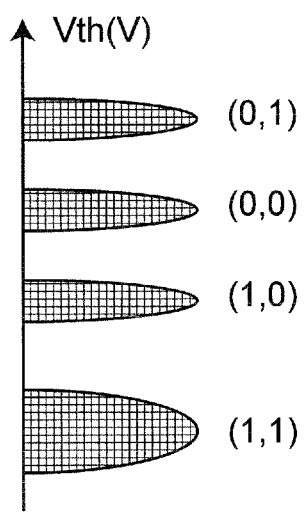
FIG. 10 is a pattern diagram illustrating a state of an electron accumulation in a quaternary flash memory.

FIG. 9 is a configurational diagram illustrating the information recording and reproducing apparatus according to the third embodiment. In FIG. 9, description about blocks with the same symbols as those of FIG. 1 is omitted. In the first embodiment, at least the flash memory that records the parity data is connected to the controller (access unit) via a memory bus different from the other flash memories. In the third embodiment, the flash memory that records the parity data is connected to some of the other flash memories via a common memory bus B. A difference between the configuration according to the third embodiment (FIG. 9) and the configuration according to the first embodiment (FIG. 1) is the access unit. In the first and second embodiments, one flash memory is connected to the access units 5a to 5e, but in the third embodiment, a plurality of flash memories is connected to one access unit. Concretely, two flash memories 6a and 6b are connected to an access unit 50, and three flash memories 6c to 6e are connected to an access unit 51.

The access unit 50 and the flash memories 6a and 6b are connected by a memory bus A, and the access unit 51 and the flash memories 6c to 6e are connected to the memory bus B.

The two flash memories 6a and 6b connected to the memory bus A record the user data, the flash memories 6c and 6d connected to the memory bus B record the user data, and the flash memory 6e records the parity data. A frequency of a clock of the memory bus A is equal to a frequency of a clock of the memory bus B. Since the reading transmission performance of the flash memories should be twice or more as high as the writing transmission performance, when the data are read from the two flash memories 6a and 6b in parallel, the clock frequency should be a frequency that can provide maximum reading transmission performance.

When a maximum writing transmission rate per one flash memory to be used is 20 MB/s and a maximum reading transmission rate is 50 MB/s, bandwidths of the two memory buses A and B may be 100 MB/s. A clock of 50 MHz may be supplied in an interface of 8-bit data using the clock of both the edges.

The bandwidth required by the memory bus A at the time of writing is a sum of the maximum writing transmission rates of the two flash memories 6a and 6b, and becomes 40 MB/s. The bandwidth required by the memory bus B at the time of writing is a sum of the maximum writing transmission rates of the three flash memories 6c to 6e, and becomes 60 MB/s. When both the bandwidths of the memory buses A and B are 100 MB/s, the ability of the flash memories can be provided at a maximum.

Further, the bandwidth required by the memory bus A at the time of reading is a sum of the maximum reading transmission rates of the two flash memories 6a and 6b, and becomes 100 MB/s. On the other hand, the bandwidth required by the memory bus B at the time of reading greatly varies according to its system.

The bandwidths required when the reading from the three flash memories 6c to 6e connected to the memory bus B is performed in parallel is a sum of the maximum reading transmission rates, and becomes 150 MB/s. For this reason, the bandwidth is insufficient in the memory bus B. However, in the third embodiment, when a reading error does not occur, the parity data does not have to be read from the flash memory 6e. For this reason, when the sum of the maximum reading transmission rates of the two flash memories 6c and 6d is secured (=100 MB/s), the bandwidth of the memory bus does not become insufficient.

Therefore, the system for reading the first parity data only when the second ECC processor detects an error in data in the first embodiment is applied to the third embodiment, an event such that the reading from the three flash memories 6c to 6e is performed in parallel in the memory bus B does not occur. For this reason, the bandwidth of the memory bus does not become insufficient.

When the system for reading data and the first parity data in parallel only in a erase block when the second ECC processor detects an error in the data in the second embodiment is applied to the third embodiment, the bandwidth of the bus becomes insufficient, and the transmission speed becomes about ⅔ of the maximum performance. However, since an occurrence rate of a reading error is assumed to be about 1%, its influence is sparse.

In the third embodiment, at least two memory buses to be connected to the flash memories are provided, and the second parity data is recorded only in the flash memory 6e connected to one memory bus B. A number (three) of the flash memories 6c, 6d and 6e to be connected to the memory bus B to which the flash memory 6e that records the second parity data is connected is made to be larger than the number (two) of the flash memories 6a and 6b to be connected to the memory bus A to which the flash memories 6a and 6b that record only the user data are connected by the number of the flash memory 6e that records the parity data. The clock frequencies of all the memory buses A and B are determined based on the memory bus A to which the flash memory 6e that records the parity data is not connected. The first reproducing mode that does not read the parity data and the second reproducing mode that reads at least the parity data are provided, so that only when a reading error occurs, the reproducing mode is switched to the second reproducing mode.

As a result, when a reading error does not occur, waste of the current consumption with respect to the performance does not occur. When a reading error occurs, the deterioration in the transmission performance and the increase in the current consumption occur, but a zone where the reading error occurs is assumed to be 1% or less of the total. For this reason, its influence is minute.

According to the third embodiment, the following information recording and reproducing apparatus 20 can be provided. The information recording and reproducing apparatus 20 can improve the error durability and suppress the current consumption at the time of high-speed reading transmission even when the plurality of nonvolatile memories that records the user data and the parity data is connected to the access units of which number is smaller than that of the memories via a common memory bus (high-speed interface).

The third embodiment describes the case where the number of memory buses is two, but their number is not limited to this. The technical idea of the embodiment can be widely applied to an information recording and reproducing apparatus that writes parity data and user data to a nonvolatile memory via one memory bus, thereby providing the similar effect.

INDUSTRIAL APPLICABILITY

In the information recording and reproducing apparatus according to the embodiments, the ECC codes are structured over the plurality of flash memories so that the error durability is improved, and the two reproducing modes are switched to be used based on presence or non-presence of a reading error, thereby realizing the low power consumption. For this reason, the information recording and reproducing apparatus can be used for memory cards for business purpose requiring high reliability and low power consumption, and devices driven by a battery such as camera recorders.

What is claimed is:

1. An information recording and reproducing apparatus for writing user data received from an external device to a recording medium, reading the user data from the recording medium and transmitting the user data to the external device, the apparatus comprising:
an external interface unit operable to transmit and receive the user data to and from the external device;
a first ECC generator operable to generate parity data corresponding to the user data;
an access unit operable to control recording and reading of the user data or the parity data to and from the recording medium;
a recording controller operable to record the user data and the parity data to the recording medium via the access unit;
an ECC correcting unit operable to correct an error of the user data read from the recording medium using the parity data read from a nonvolatile memory via the access unit; and
a reproducing controller having a first reproducing mode for reading and reproducing the user data without reading the parity data from the recording medium at the time of reproducing data and a second reproducing mode for reading and reproducing at least the parity data from the recording medium, the reproducing controller operable to detect presence or non-presence of an error of the user data read from the recording medium during execution of the first reproducing mode and executing the second reproducing mode when the presence of an error is detected,
wherein a plurality of recording media is provided,
wherein the access unit is provided in a same number as the recording media,
wherein the user data is divided to a plurality of data,
wherein the recording controller records the divided user data and the parity data to the corresponding recording medium via the corresponding access unit, and
wherein, when the first reproducing mode is executed, the reproducing controller controls the access unit that controls the recording medium recording the parity data to make a control signal to the recording medium inactive.

2. The information recording and reproducing apparatus according to claim 1,
wherein the recording controller divides the parity data and the user data to blocks of a same size with a recording block size of the recording medium and records the parity data and the user data, which are divided to the blocks, to recording blocks of the recording medium, and wherein the ECC correcting unit reads the parity data corresponding to the user data read from the recording medium and corrects an error of the user data.

3. The information recording and reproducing apparatus according to claim 1, wherein when switching from the first reproducing mode to the second reproducing mode, the reproducing controller continuously executes the second reproducing mode on an erase block that includes user data in which presence of an error is detected.

4. The information recording and reproducing apparatus according to claim 1,
wherein the recording medium includes a recording medium for recording the parity data and a recording medium for recording the user data,
wherein the recording controller records the user data and the parity data to the corresponding recording media via the access units, respectively, and
wherein the recording medium for recording the parity data and the recording medium for recording the user data are connected to the access units via a common memory bus.

5. The information recording and reproducing apparatus according to claim 1, further comprising:
a second ECC generating unit operable to generate an ECC code so that the ECC code is orthogonal to the parity data,
wherein the reproducing controller detects a reading error using the ECC code in the first reproducing mode.

6. The information recording and reproducing apparatus according to claim 1, wherein the recording medium is a nonvolatile memory.

7. An information recording and reproducing apparatus for writing user data received from an external device to a recording medium, reading the user data from the recording medium and transmitting the user data to the external device, the apparatus comprising:
an external interface unit operable to transmit and receive the user data to and from the external device;
a first ECC generator operable to generate parity data corresponding to the user data
an access unit operable to control recording and reading of the user data or the parity data to and from the recording medium;
a recording controller operable to record the user data and the parity data to the recording medium via the access unit;
an ECC correcting unit operable to correct an error of the user data read from the recording medium using the parity data read from a nonvolatile memory via the access unit; and
a reproducing controller having a first reproducing mode for reading and reproducing the user data without reading the parity data from the recording medium at the time of reproducing data and a second reproducing mode for reading and reproducing at least the parity data from the recording medium, the reproducing controller operable to detect presence or non-presence of an error of the user data read from the recording medium during execution of the first reproducing mode and executing the second reproducing mode when the presence of an error is detected,
wherein the recording medium includes a recording medium for recording the parity data and a plurality of recording media for recording the user data,
wherein a first access unit and a second access unit are provided as the access unit,
wherein the user data is divided into a plurality of data,
wherein the recording controller records the divided user data and the first parity data to the corresponding recording media via the corresponding access unit,
wherein the recording medium for recording the parity data and a part of the plurality of recording media for recording the user data are connected to the first access units via a first memory bus,
wherein the remaining recording media for recording the user data are connected to the second access unit by a second memory bus, and
wherein the number of the recording media connected to the first memory bus is larger than the number of the recording media connected to the second memory bus.

8. The information recording and reproducing apparatus according to claim 7, wherein the memory bus connected to the recording medium for recording the parity data operates at a same clock frequency as that of the memory bus that is not connected to the recording medium for recording the parity data.

9. The information recording and reproducing apparatus according to claim 7, further comprising:
a second ECC generating unit operable to generate an ECC code so that the ECC code is orthogonal to the parity data,
wherein the reproducing controller detects a reading error using the ECC code in the first reproducing mode.

10. The information recording and reproducing apparatus according to claim 7, wherein the recording medium is a nonvolatile memory.

* * * * *